(12) United States Patent
Fang et al.

(10) Patent No.: US 8,230,377 B1
(45) Date of Patent: Jul. 24, 2012

(54) CONTROL SET CONSTRAINT DRIVEN FORCE DIRECTED ANALYTICAL PLACER FOR PROGRAMMABLE INTEGRATED CIRCUITS

(75) Inventors: Wei Mark Fang, Campbell, CA (US); Srinivasan Dasasathyan, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 348 days.

(21) Appl. No.: 12/429,991

(22) Filed: Apr. 24, 2009

(51) Int. Cl.
G06F 17/50 (2006.01)

(52) U.S. Cl. ........ 716/124; 716/104; 716/105; 716/118; 716/119

(58) Field of Classification Search .................... 716/124
See application file for complete search history.

(56) References Cited

U.S. PATENT DOCUMENTS

| | | | |
|---|---|---|---|
| 2003/0182649 A1* | 9/2003 | Harn | 716/11 |
| 2008/0127018 A1* | 5/2008 | Alpert et al. | 716/10 |
| 2010/0031214 A1* | 2/2010 | Hou et al. | 716/9 |

OTHER PUBLICATIONS

Eisenmann, Hans et al., "Generic Global Placement and Floorplanning," *Proc. of the 1998 Design Automation Conference*, Jun. 15-19, 1998, pp. 269-274, San Francisco, California, USA.
Xilinx, Inc., *Virtex-5 FPGA User Guide*, Dec. 2, 2008, p. 174, available from Xilinx, Inc., San Jose, California, USA.
U.S. Appl. No. 12/272,496, filed Nov. 17, 2008, Srinivasan.
U.S. Appl. No. 12/429,842, filed Apr. 24, 2009, Srinivasan et al.

* cited by examiner

*Primary Examiner* — Paul Dinh
*Assistant Examiner* — Bryce Aisaka
(74) *Attorney, Agent, or Firm* — Kevin T. Cuenot

(57) ABSTRACT

A computer-implemented method of globally placing a circuit design on a programmable integrated circuit (IC) includes dividing, by a placement system, the programmable IC into a grid comprising a plurality of cells, assigning each component of a selected component type of the circuit design to one of a plurality of control set groups according to a control set of the component, and calculating a force including a control set force that depends upon overlap of control sets within the plurality of cells. The method further can include applying the force to at least one selected component of the circuit design and assigning components of the circuit design to locations on the programmable IC by solving a set of linear equations that depend upon application of the force to the at least one selected component to create a global placement. The circuit design including the global placement can be output.

20 Claims, 5 Drawing Sheets

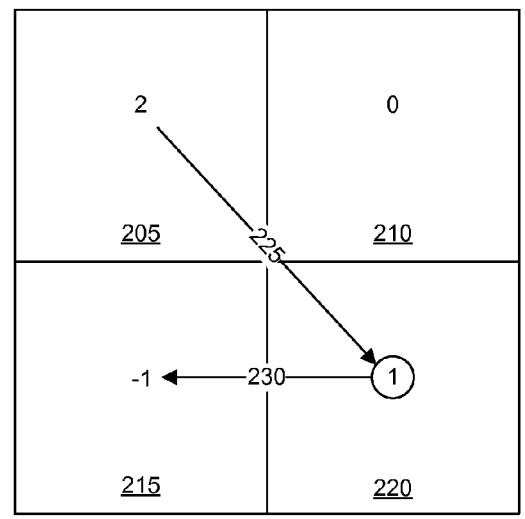
|  |  |
|---|---|
| 3-1=2 | 1-1=0 |
| 205 | 210 |
| 0-1=-1 | 2-1=1 |
| 215 | 220 |
FIG. 2
FIG. 3
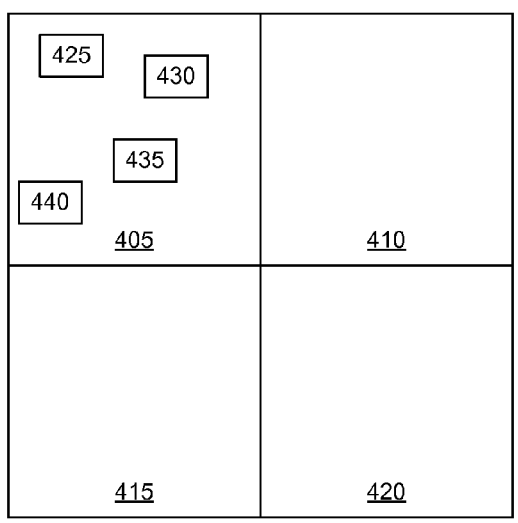
FIG. 4

CONTROL SET CONSTRAINT DRIVEN FORCE DIRECTED ANALYTICAL PLACER FOR PROGRAMMABLE INTEGRATED CIRCUITS

FIELD OF THE INVENTION

The embodiments disclosed within this specification relate to integrated circuit devices. More particularly, the embodiments relate to placing a circuit design on a programmable integrated circuit device.

BACKGROUND

Programmable integrated circuit devices (programmable ICs) are a well-known type of integrated circuit that can be programmed to perform specified logic functions. Examples of programmable ICs include the field programmable gate array (FPGA) and the complex programmable logic device (CPLD). The functionality of most programmable ICs is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

When a circuit design is implemented on a programmable IC, the components of the circuit design must be assigned to suitable programmable resources on the programmable IC. This process is referred to as "placement." Placement generally includes two phases. The first phase is referred to as "global placement." During global placement, each component of the circuit design is assigned an (x, y) coordinate location on the programmable IC. Each (x, y) coordinate assignment, however, does not necessarily coincide with a location of a programmable hardware resource, referred to as a "site," on the programmable IC. During the second phase of placement, referred to as "detailed placement," each component is assigned to a particular site on the programmable IC that is nearby the (x, y) coordinate determined for that component during the global placement phase.

SUMMARY

The embodiments disclosed within this specification relate to placing a circuit design for implementation upon a programmable integrated circuit device (programmable IC). One embodiment of the present invention can include a computer-implemented method of globally placing a circuit design on a programmable IC. The method can include subdividing, by a placement system, the programmable IC into a grid including a plurality of cells and assigning each component of a selected component type of the circuit design to one of a plurality of control set groups according to a control set of the component. The method further can include calculating a force including a control set force component that depends upon control set overlap within the plurality of cells, applying the force to at least one selected component of a cell comprising overlap, and assigning components of the circuit design to locations on the programmable IC by solving a set of linear equations that depend upon application of the force to the selected component(s), thereby specifying a global placement. The circuit design including the global placement can be output.

Calculating a force can include calculating the control set force component as a function of control set density. The method can include selecting the control set density to depend upon a control set capacity specifying a number of allowed control sets within at least one selected cell and a control set occupancy specifying a number of control sets that exist within the at least one selected cell.

The method can include selecting the component(s) to which the force is applied. In one aspect, the overlap can be control set overlap. Accordingly, the method can include selecting at least one of the plurality of cells including control set overlap as a current cell, wherein the current cell includes a plurality of control set clusters, identifying each control set group in the current cell, wherein each control set group is defined by each flip-flop having a same control set, and ordering the control set groups. Components of the control set groups can be allocated to control set clusters of the current cell according to the ordering of the control set groups. Each component not allocated to a control set cluster can be selected for application of the force.

Allocating components of the control set groups to control set clusters can include first allocating control set clusters to each control set group including at least one locked component and second allocating control set clusters to components of control set groups according to size of each control set group.

The method also can include selectively adjusting the control set force for at least one subsequent iteration of global placement.

Another embodiment of the present invention can include a system for globally placing a circuit design on a programmable IC. The system can include a memory including computer-usable program code and a processor that, when executing the computer-usable program code, performs a plurality of steps. The processor can subdivide the programmable IC into a grid including a plurality of cells, assign each component of a selected component type of the circuit design to one of a plurality of control set groups according to a control set of the component, and calculate a force including a control set force component that depends upon control set overlap within the plurality of cells. The processor further can apply the force to at least one selected component of a cell including overlap and assign components of the circuit design to locations on the programmable IC by solving a set of linear equations that depend upon application of the force to the selected component(s), thereby specifying a global placement. The system can output the circuit design including the global placement.

The processor can calculate the control set force component as a function of control set density. The processor further can select the control set density to depend upon a control set capacity specifying a number of allowed control sets within at least one selected cell and a control set occupancy specifying a number of control sets that exist within the at least one selected cell.

The processor can select the component(s) to which the force is applied. In one aspect, the overlap can be control set overlap. Accordingly, the processor can select at least one of the plurality of cells including control set overlap as a current cell, wherein the current cell includes a plurality of control set clusters, identify each control set group in the current cell, wherein each control set group is defined by each flip-flops having a same control set, and order the control set groups. Accordingly, the processor can allocate components of the control set group to control set clusters of the current cell according to the ordering of the control set groups and select each component not allocated to a control set cluster for application of the force.

The processor can first allocate control set clusters to each control set group including at least one locked component and second allocate control set clusters to components of control set groups according to size of each control set group.

The processor also can selectively adjust the control set force for at least one subsequent iteration of global placement.

Yet another embodiment of the present invention can include a computer program product including a computer-usable medium having computer-usable program code that, when executed by a computer, globally places a circuit design on a programmable IC. The computer-usable medium can include computer-usable program code that subdivides the programmable IC into a grid comprising a plurality of cells. The medium can further include: computer-usable program code that assigns each component of a selected component type of the circuit design to one of a plurality of control set groups according to a control set of the component; computer-usable program code that calculates a force comprising a control set force component that depends upon control set overlap within the plurality of cells; and computer-usable program code that applies the force to at least one selected component of a cell comprising overlap. In addition, the medium can include: computer-usable program code that assigns components of the circuit design to locations on the programmable IC by solving a set of linear equations that depend upon application of the force to the at least one selected component, thereby specifying a global placement; and computer-usable program code that outputs the circuit design comprising the global placement.

The computer-usable program code that calculates a force can include computer-usable program code that calculates the control set force component as a function of control set density. The medium can further include computer-usable program code that selects the control set density to depend upon a control set capacity specifying a number of allowed control sets within at least one selected cell and a control set occupancy specifying a number of control sets that exist within the at least one selected cell. The medium can include computer-usable program code that selects the at least one component to which the force is applied.

In one aspect, the overlap can be control set overlap. In that case, the medium can further include: computer-usable program code that selects at least one of the plurality of cells comprising control set overlap as a current cell, wherein the current cell comprises a plurality of control set clusters; computer-usable program code that identifies each control set group in the current cell, wherein each control set group is defined by each flip-flop having a same control set; computer-usable program code that orders the control set groups; computer-usable program code that allocates components of the control set groups to control set clusters of the current cell according to the ordering of the control set groups; and computer-usable program code that selects each component not allocated to a control set cluster for application of the force. The computer-usable program code that allocates components of the control set groups to control set clusters can include computer-usable program code that first allocates control set clusters to each control set group comprising at least one locked component; and computer-usable program code that second allocates control set clusters to components of control set groups according to size of each control set group.

BRIEF DESCRIPTION OF THE DRAWINGS

FIG. 2 is a second block diagram illustrating a density map in accordance with another embodiment of the present invention.

FIG. 3 is a third block diagram illustrating the density map of FIG. 2 showing different physical forces involving a cell.

FIG. 4 is a fourth block diagram illustrating a placement solution for a programmable IC that includes control set overlap.

DETAILED DESCRIPTION OF THE DRAWINGS

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the embodiments of the invention.

The embodiments disclosed within this specification relate to placing a circuit design within a programmable integrated circuit device (programmable IC). More particularly, the inventive arrangements relate to globally placing a circuit design while accounting for control set constraints. Current techniques for performing global placement do not account for control set constraints, thereby resulting in decreased utilization of the resources of the programmable IC. When decreased resource utilization of the programmable IC becomes commonplace, the placement system is likely to generate infeasible placement solutions for a significant number of circuit designs.

A "control set constraint" refers to an architectural constraint of the programmable IC. In general, a control set constraint influences where particular component types of a circuit design can be located on a programmable IC during placement. Some programmable ICs are designed with clustered architectures where sites are pre-fabricated close together in groups referred to as slices. A "site," as used herein, refers to a particular hardware unit, e.g., a hardware resource, at a particular location on the programmable IC.

One example of a control set constraint is that, within a programmable IC, it is often the case that each flip-flop assigned to a selected slice must share the same input clock (CLK), set (SR), and enable (CE) signals as each other flip-flop within that slice. Thus, if a flip-flop is connected to a set of control signals CLK, SR, and CE, each other flip-flop assigned to that same slice also must have the same set of control signals. In this example, the control set of a given component, in this case a flip-flop, is defined by the set of signals CLK, SR, and CE.

Figure 1:
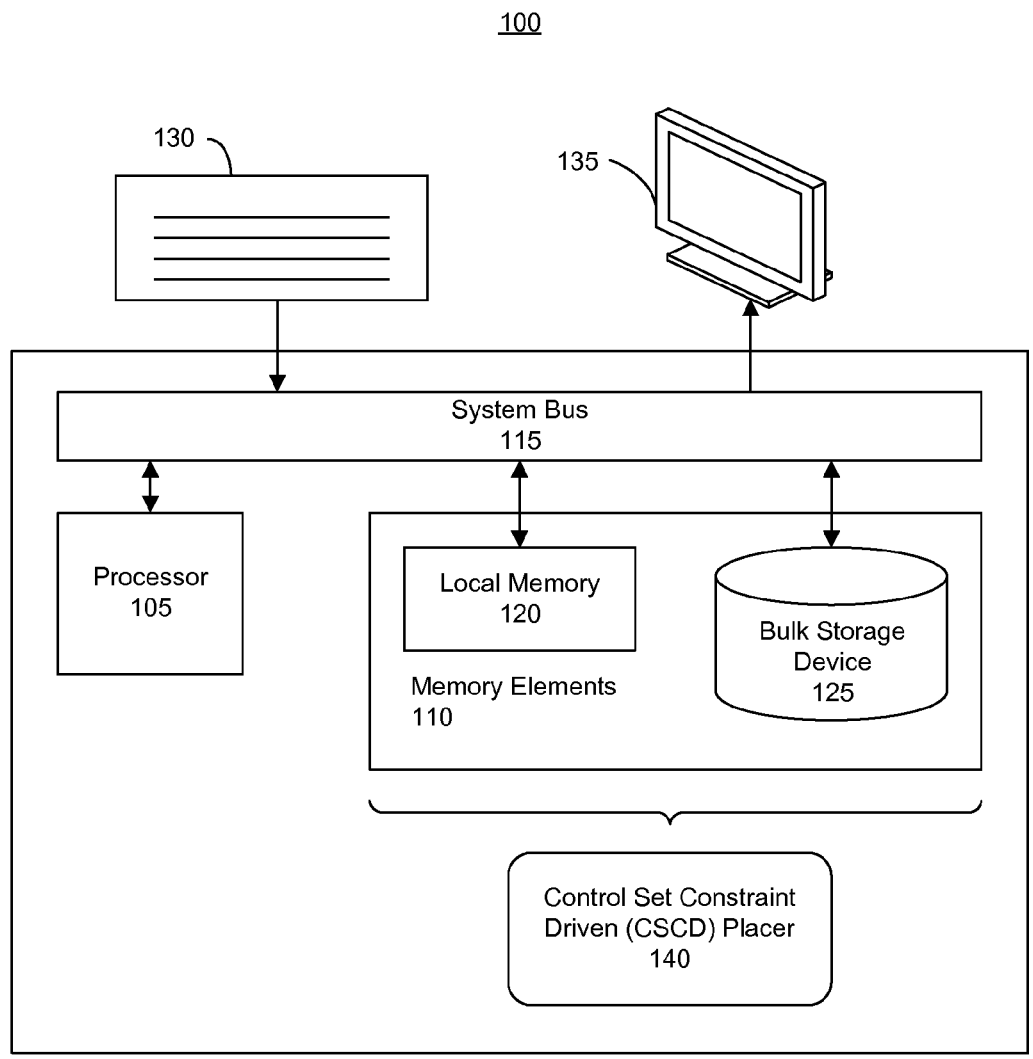
FIG. 1 is a first block diagram illustrating a system for placing a circuit design on programmable integrated circuit device (programmable IC) in accordance with one embodiment of the present invention.

FIG. 1 is a first block diagram illustrating a placement system 100 for placing a circuit design on a programmable IC in accordance with one embodiment of the present invention. In one aspect, placement system 100 can implement a circuit design for instantiation, or implementation, within a programmable IC. Placement system 100 can be implemented in the form of a computer that is suitable for storing and/or executing computer-usable program code (program code). Accordingly, placement system 100 can include at least one processor 105 coupled directly or indirectly to memory elements 110 through a system bus 115.

Memory elements 110 can include one or more physical memory devices such as, for example, local memory 120 and one or more bulk storage devices 125. Local memory 120 refers to random access memory or other non-persistent memory device(s) generally used during actual execution of the program code. Bulk storage device(s) 125 can be implemented as a hard drive or other persistent data storage device. Placement system 100 also can include one or more cache memories (not shown) that provide temporary storage of at least some program code in order to reduce the number of times program code must be retrieved from bulk storage device 125 during execution.

Input/output (I/O) devices such as a keyboard 130, a display 135, and a pointing device (not shown) optionally can be coupled to system 100. The I/O devices can be coupled to system 100 either directly or through intervening I/O controllers. Network adapters also can be coupled to placement system 100 to enable placement system 100 to become coupled to other computer systems, remote printers, and/or remote storage devices through intervening private or public networks. Modems, cable modems, and Ethernet cards are examples of different types of network adapters that can be used with placement system 100.

As shown, memory elements 110 of placement system 100 can store a circuit design tool such as a control set constraint driven (CSCD) placer 140. In one embodiment, CSCD placer 140 can perform global placement while incorporating control set constraints to be applied to the circuit design being placed and relating to the programmable IC upon which the circuit design is to be placed (the target "programmable IC"). In another embodiment, CSCD placer 140 also can perform detailed placement of the circuit design. CSCD placer 140 can utilize aspects of Force Directed Analytical Placement while also incorporating control set constraints to be described herein in greater detail.

Placement system 100, when executing CSCD placer 140, can perform a global placement of a circuit design while accounting for control set constraints relating to the target programmable IC. In operation, placement system 100 can output a placement solution for a given circuit design in the form of a vector X of length V. Each element of vector X can be specified in the form of (x, y), representing the x coordinate and the y coordinate of the placement of each free component of the circuit design. Length V can represent the number of free components of the circuit design, where the number of free components corresponds to the number of (x,y) coordinate pairs. Placement system 100 can determine locations for components of the circuit design by solving for the vector X while optimizing a selected metric.

The formulation of the placement problem solved by placement system 100 can be represented in canonical form as $AX=B+e$. Within this formulation, A can represent a matrix specifying the connectivity between all components of the circuit design being placed. Components that are connected have high values in the matrix A. B can be the matrix of values representing anchoring components that are already placed, e.g., are not free. As used herein, an "anchor" or an "anchor component" refers to a component of the circuit design being placed that has a predetermined placement or location and, as such, cannot be freely moved about the programmable IC during the placement process as is the case with a "free component".

As noted, placement system 100 seeks to solve for the vector X while minimizing a selected metric. In one embodiment, the selected metric can be wire length. Wire length refers to the length of wire needed to connect the components of the circuit design together after being placed on the programmable IC. When seeking to minimize wire length, which serves as a proxy for the distance between components, the minimum solution often includes physical overlaps and control set overlaps. Such is the case as the most optimum placement solution in terms of wire length would include significant overlap, as the wire length between two overlapped components effectively can be zero.

Physical overlap refers to a condition in which two or more components of the circuit design are assigned to locations on the programmable IC that overlap with one another. Physical overlap is an infeasible condition that must be removed prior to implementation of the circuit design within the target programmable IC. One way of representing physical overlap in terms of placing a circuit design is through the use of a density map, where "density" serves as a metric for physical overlap.

Control set overlap refers to a condition in which a given portion of the programmable IC is assigned components belonging to a number of control sets that is larger than the number of control sets supported, or that can be accommodated, within the portion of the programmable IC. For example, if a slice is able to include flip-flops belonging to a single control set, placing two flip-flops within a single slice, where each flip-flop belongs to a different control set is a control set overlap condition. Control set overlap can be represented in terms of control set density, which will be described in greater detail within this specification.

The force vector e represents a force that placement system 100 selectively exerts on components while solving for the vector X. The force vector e can be a compound vector formed by combining, or summing, two different force components. The first force component of force vector e, denoted as $e_{PHY}$, represents one or more physical forces that seek to remove physical overlap within the circuit design. The first force component, when applied to a selected component, can move the component from an area of high physical overlap to an area of low physical overlap. The second force component of force vector e, denoted as $e_{CS}$, represents one or more control set forces that seek to remove control set overlap within the circuit design. The second force component, when applied to a selected component, can push the component from an area of high control set overlap to an area of low control set overlap.

While wire length is used as a metric for optimization during placement, it should be appreciated that other metrics can be used in lieu of wire length. For example, power consumption can be a metric that can be optimized in terms of reducing power consumption of the circuit design. In another example, timing can be used as a metric that can be optimized. Accordingly, the embodiments described herein are not intended to be limited solely to the use of wire length as a metric for optimization during global placement of the circuit design.

FIG. 2 is a second block diagram illustrating a density map 200 in accordance with another embodiment of the present invention. Density, in general, can be used as a measure of overlap for a given placement of a circuit design upon a programmable IC, whether physical overlap or control set overlap. In this regard, $e_{PHY}$ can be calculated using physical density as a proxy, or measure, of physical overlap. Density map 200 can be generated by creating a rectangular grid over the area of the target programmable IC. The grid can include a plurality of cells. For purposes of illustration, each cell of the grid can be a configurable logic block (CLB). As such, each cell can include two slices. Thus, each of cells 205, 210, 215, and 220 can represent a CLB having two slices.

It should be appreciated that the selection of a CLB as corresponding to the size of a cell is for purposes of illustration only. One can select other sizes for cells of the density map without departing from the spirit of the embodiments disclosed within this specification. As such, the embodiments are not intended to be limited to one particular size of a cell.

Each of cells 205-220 has a physical occupancy and a physical capacity. The physical capacity of a cell refers to the number of a selected component type, e.g., a flip-flop, that can be held or accommodated by the cell. For example, the physical capacity can refer to the number sites within the cell to which a flip-flop can be placed or assigned. The physical occupancy of a cell refers to the number of components of the selected component type that have been assigned to the cell. The metric for physical overlap, e.g., physical density, can be determined according to equation 1 below.

$$\text{Density}_{PHY} = \text{Occupancy}_{PHY} - \text{Capacity}_{PHY} \quad (1)$$

Within equation 1, physical density is denoted by Density$_{PHY}$; physical occupancy is denoted by Occupancy$_{PHY}$; and physical capacity is denoted by Capacity$_{PHY}$.

For ease of illustration, consider the case where each cell has a physical capacity of only one flip-flop. In cell 205, when the physical occupancy is 3, e.g., three flip-flops have been assigned to cell 205, the physical density is 2. In cell 210, when the physical occupancy is 1, the physical density is 0. In cell 215, when the physical occupancy is 0, the physical density is −1. In cell 220, when the physical occupancy is 2, the physical density is 1.

The physical density of each cell indicates the amount of physical overlap in that cell. Positive numbers indicate that physical overlap exists in the cell. Larger positive numbers indicate greater levels of physical overlap in the cell. As noted, the first force component $e_{PHY}$ of force vector e removes physical overlap of components within the circuit design by moving components away from areas of high physical overlap to areas of low physical overlap. In one embodiment, $e_{PHY}$ can be calculated from a physical density map of a current global placement for the circuit design.

FIG. 3 is a third block diagram illustrating the physical density map of FIG. 2 showing different physical forces involving cell 220. In general, each cell having a positive physical density exerts a repulsive physical force. Each cell having a zero physical density exerts a physical force of zero. Each cell having a negative physical density exerts an attractive physical force. The strength of the physical force exerted by a cell is proportional to the density of each neighboring cell. In the example pictured in FIG. 3, cell 205 exerts a repulsive physical force 225 on cell 220. Physical force 230 represents an attractive physical force exerted by cell 215 upon cell 220.

Considering the physical forces illustrated in FIG. 3, the first force component $e_{PHY}$ of force vector e can be calculated by solving equation 2 below.

$$e_{PHY} = f_{PHY}(x, y) = k_{PHY} \int \int \text{density}_{PHY}(x, y) \frac{(x, y) - (x', y')}{|(x, y) - (x', y')|^2} dx' dy' \quad (2)$$

In equation 2, $f_{PHY}(x,y)$, or $e_{PHY}$, represents the physical force exerted on a cell, having a center (x,y), by neighboring cells with center(s) (x',y'). The range of the double integral is the range of neighboring cells over which a physical force is to be computed. In this regard, the range of the double integrals can differ according to preference and distance from the subject cell from which physical forces are to be considered. Greater range in the double integrals provides greater accuracy at the cost of increased computations and computer resources. The constant term $k_{PHY}$ is a scaling factor that adjusts the strength of each physical force accounted for in the first force component. The term density$_{PHY}(x,y)$ refers to the physical density, e.g., as taken from the physical density map, of a cell having a center at (x,y).

FIG. 4 is a fourth block diagram illustrating a placement solution 400 for a programmable IC that includes control set overlap. A control set overlap also can be referred to as a control set violation. As noted, a control set violation refers to the condition in which a given portion of the target programmable IC has been assigned components belonging to a number of control sets that exceeds the number of control sets permissible within that portion of the target programmable IC.

Referring to FIG. 4, for example, a portion of the target programmable IC is shown that comprises four slices 405, 410, 415, and 420. For purposes of illustration, consider the case where each of slices 405-420 is governed by a control set constraint indicating that each slice can include up to four flip-flops and that each flip-flop within a slice must belong to the same control set. Thus, each of slices 405-420 can include only flip-flops of a single control set. In illustration, each of slices 405-420 can include four flip-flop sites, in reference to a site that can be programmed to implement a flip-flop or that can be placed with a flip-flop. A conventional placement system has performed global placement and assigned four flip-flops 425, 430, 435, and 440 to slice 405.

Consider the case where each of flip-flops 425-440 belongs to a different control set, thereby creating a control set violation. Because conventional placement systems do not account for control set constraints during global placement, such control set violations are entirely possible and do occur. This global placement solution seeks to maximize utilization of the resources of the programmable IC by utilizing each of the four flip-flop sites of slice 405, but also violates the control set constraint. A control set violation, or control set overlap, like a physical overlap, must be removed prior to implementation of the circuit design on the target programmable IC.

When a conventional placement system generates a global placement solution that includes a control set violation, as shown in FIG. 4, the detailed placement phase is tasked to remove the control set violation(s). If the detailed placement phase successfully removes the control set violations, the resulting placement may be feasible, but exhibit significant degradation in circuit performance since the flip-flops likely are moved large distances across the programmable IC.

Prior to discussing the embodiments of the invention in greater detail, it is worthwhile to consider various definitions and/or quantities that will be helpful in understanding aspects of the embodiments presented within this specification. The second force component of force vector e, denoted as the control set force $e_{CS}$, seeks to remove control set overlaps of the variety illustrated in FIG. 4 from cells. As noted, a control set constraint refers to an architectural constraint of the programmable IC. Within this specification, the control set constraint used for illustration purposes is the control set constraint that limits the number of flip-flop control sets that can exist, or be assigned, to a given portion of a programmable IC. It should be appreciated, however, that other components can be subject to control sets and that the embodiments described within this specification can be applied to such components as well.

A "control set group" can refer to a set of one or more of a selected component type, e.g., flip-flop, that is defined by the same control set. As discussed with reference to flip-flops, a control set is defined by the set of signals including CLK, SR, and CE. The phrase "control set cluster" refers to a set of one or more sites that must have components of a same control set, e.g., a control set group, assigned thereto. For example, a control set group comprised of flip-flops can be placed or assigned to a control set cluster comprising flip-flop sites.

A control set density map can be created that reflects the control set density of each cell when the programmable IC is subdivided into a grid of a plurality of cells. Consider the case where each cell of a control set density map of a target programmable IC includes two slices. If each slice can include only flip-flops of a same control set, each slice corresponds to one control set cluster. Accordingly, each cell represents two control set clusters. Using control set groups and control set clusters, the "control set capacity" of a cell can be defined as the number of control sets that are permitted to be located within that cell, which corresponds to the number of control set clusters within that cell. In this example, each cell of the target programmable IC has a control set capacity of two. The "control set occupancy" of a cell refers to the number of unique control sets that have been placed into the cell.

Using control set capacity and control set occupancy, the control set density, denoted as $density_{CS}$, of a given cell can be calculated according to equation 3 below.

$$density_{CS} = MAX(1, Occupancy_{CS} - Capacity_{CS})*(number\ of\ physical\ sites) \quad (3)$$

Within equation 3, the term "$Occupancy_{CS}$" represents "control set occupancy" and the term "$Capacity_{CS}$" represents "control set capacity." The number of physical sites is the total number of physical sites available within the particular cell for which $density_{CS}$ is being calculated.

Accordingly, $density_{CS}$ for a given cell is calculated by first subtracting $Capacity_{CS}$ from $Occupancy_{CS}$. The greater of that difference or the value of 1 is then multiplied by the number of physical sites available within the cell. As such, $density_{CS}$ always yields a positive value. Positive control set density values, as will be apparent from the description of control set forces below, result in repulsive control set forces. It should be appreciated that the use of only positive control set densities is used for purposes of illustration and simplifies the operation of the placement system described herein. In another embodiment, however, both positive and negative control set densities can be used, e.g., where the MAX operator is not used. Using both positive and negative control set densities generates both repulsive and attractive forces in terms of control set forces.

The second force component $e_{CS}$ of force vector e representing control set forces can be calculated by solving equation 4 below.

$$e_{CS} = f_{CS}(x, y) = k_{CS} \int \int density_{CS}(x, y) \frac{(x, y) - (x', y')}{|(x, y) - (x', y')|^2} dx' dy' \quad (4)$$

In equation 4, $f_{CS}(x,y)$, or $e_{CS}$, represents the control set force exerted on a cell, having a center $(x,y)$, by neighboring cells with center(s) $(x',y')$. The range of the double integral is the range of neighboring cells from which contributions to the control set force exerted on the cell having a center $(x,y)$ are to be considered. In this regard, the range of the double integrals can differ according to preference and distance from the subject cell from which control set forces are to be considered. Greater range in the double integrals provides greater accuracy at the cost of increased computations and computer resources. The constant term $k_{CS}$ is a scaling factor that adjusts the strength of each of the control set forces accounted for in $e_{CS}$. The term $density_{CS}(x,y)$ refers to the control set density, e.g., as taken from a control set density map, of a cell having a center at $(x,y)$.

Figure 5:
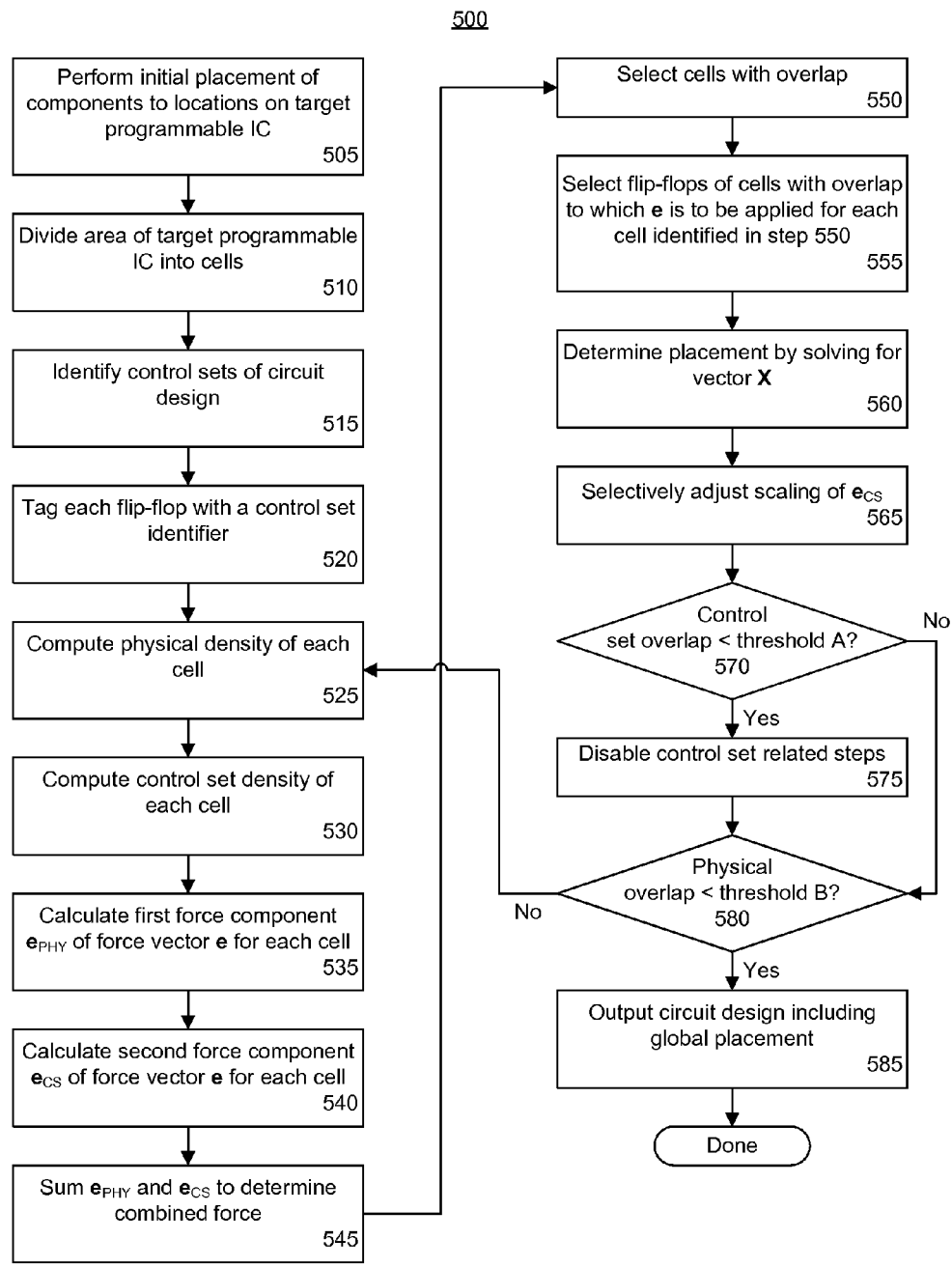
FIG. 5 is a first flow chart illustrating a method of globally placing a circuit design in accordance with another embodiment of the present invention.

FIG. 5 is a first flow chart illustrating a method 500 of globally placing for a circuit design in accordance with another embodiment of the present invention. Method 500 can be performed by a placement system as described with reference to FIG. 1 (hereafter "the system"). The method can begin in a state where a programmatic description of a circuit design has been created and is ready for placement to be performed with reference to a target programmable IC having a particular architecture. As such, the target programmable IC can be subject to one or more control set constraints.

It should be appreciated that the embodiments described within this specification can be applied to any of a variety of different component types and/or corresponding site types so long as each is subject to a control set constraint or constraints. As such, the use of a flip-flop type of component and flip-flop site within this specification is for purposes of illustration only and is not intended as a limitation of the embodiments disclosed herein.

Method 500 can begin in step 505, where the placement system can perform an initial global placement of components of a circuit design. The placement system can locate, or assign, components of the circuit design to different locations on the target programmable IC. In one embodiment, the placement system can randomly assign components to locations on the target programmable IC. The random assignment of components can permit physical overlap conditions, control set overlap conditions, or both. In another embodiment, the placement system can utilize a fast placement technique to generate a non-random assignment of components to locations on the target programmable IC. This non-random placement also can permit overlap conditions, whether physical overlap and/or control set overlap. In either case, the initial placement serves as a starting point for the iterative global placement technique described with reference to FIG. 5.

In step 510, the placement system can divide the area of the target programmable IC into a plurality of cells. For purposes of illustration, it can be assumed that each cell of the grid is the equivalent of a slice of a configurable logic block of the target programmable IC. In step 515, the placement system can determine, or identify, the different control sets that exist within the circuit design. As noted, each control set is defined by the CLK, SR, and CE signals of a flip-flop. Accordingly, each unique combination of CLK, SR, and CE signals connected to flip-flops, as interpreted by the placement system and as specified by the circuit design, defines one control set. In step 520, the placement system can tag each flip-flop with a control set identifier that identifies, or indicates, the particular control set to which that flip-flop belongs. The tag assigned to a particular flip-flop, for example, can identify, or correlate with, a unique combination of CLK, SR, and CE signals.

In step 525, the placement system can calculate the physical density of each cell. In step 530, the placement system can calculate the control set density of each cell. In one embodiment, the placement system can evaluate the tag for each flip-flop within a cell as an efficient way to determine control set density for that cell. In step 535, the placement system can calculate the first force component $e_{PHY}$ of force vector e of each cell. In step 540, the placement system can calculate the second force component $e_{CS}$ of force vector e of each cell.

In step 545, the placement system can determine the force vector e, representing the combined force, as a function of $e_{PHY}$ and $e_{CS}$. In one embodiment, e is calculated by summing $e_{PHY}$ and $e_{CS}$. In summing the two force components, a scaling factor $\alpha$ can be introduced and used to control the contribution of $e_{CS}$ to the combined force. For example, for a cell having coordinates (x,y), the combined force exerted on that cell can be defined according to equation 5 below.

$$e = e_{PHY} + \alpha e_{CS} \quad (5)$$

Each of $e_{PHY}$ and $e_{CS}$ has a direction and a strength. The directions and strengths of $e_{PHY}$ and $e_{CS}$ are summed to generate the combined force e which also has a direction and a strength. In one embodiment, $\alpha$ can be assigned an initial value of 1, though any of a variety of weightings can be used to vary the contribution of $e_{CS}$ to e.

In step 550, the placement system can select the cells that exhibit overlap. Initially in step 550, the placement system can select the cells that exhibit control set overlap. A cell with control set overlap, e.g., a control set violation, is a cell where Occupancy$_{CS}$>Capacity$_{CS}$. In subsequent iterations of step 550, when the overall control set overlap becomes less than a particular threshold, to be described herein in greater detail, the placement system can select the cells that exhibit physical overlap in lieu of cells that exhibit control set overlap.

In step 555, of the cells identified in step 550 having overlap, the placement system can select flip-flops to which the combined force determined for each respective cell is to be applied. The placement system can assign and/or apply the combined force to such components. As noted, the force vector e specifies the combined force for a given cell that is applied to selected components within that cell during an iteration of method 500. During each iteration of method 500, a placement solution is determined by solving the expression AX=B+e for the vector X.

It should be appreciated that initially in step 555, the placement system selects flip-flops, e.g., components, to which the combined force is applied from those cells identified in step 550 as having control set overlap. In subsequent iterations of step 555, when the overall control set overlap becomes less than the particular threshold, the placement system can select flip-flops to which the combined force determined for each respective cell is to be applied from those cells having physical overlap, as determined in step 550, as opposed to control set overlap. When selecting components for application of the combined force within cells identified as having physical overlap, any of a variety of different selection methods can be used, e.g., to minimize timing, minimize power consumption, or the like.

In step 560, the placement system can determine a placement solution, e.g., a current placement, for the circuit design by solving for the vector X. The expression AX=B+e can be solved using any of a variety of linear system solving techniques. For example, a linear system of equations as specified by the expression AX=B+e can be solved using the Guass-Siedel method, the conjugate gradient method, or any other suitable programmatic method of solving a system of linear equations. The particular techniques disclosed herein are not intended to limit the embodiments of the invention.

In step 565, the placement system can selectively scale the contribution of $e_{CS}$. In one embodiment, the scaling of $e_{CS}$ can be performed on a per-iteration basis. For example, each time method 500 iterates, thereby generating a new potential placement solution, the contribution of $e_{CS}$ relative to $e_{PHY}$ can be scaled or adjusted by changing the value of $\alpha$. In another embodiment, the value of $\alpha$ can be adjusted responsive to the overall control set overlap decreasing or increasing by some predetermined amount, e.g., a percentage.

In illustration, the value of $\alpha$ can be initially set, e.g., during the first iteration of method 500, to a value of 1. After each iteration, if the overall control set overlap decreases by some fixed amount, e.g., a 10% improvement from the prior iteration to the current iteration, the value of $\alpha$ can be decreased by 0.1 or some other predetermined amount. Alternatively, the value of $\alpha$ can be adjusted dynamically, where the size of the adjustment depends upon the amount of improvement in the overall control set overlap. This does not preclude increasing $\alpha$ when overall control set overlap worsens. The manner in which the value of $\alpha$ is changed is not intended to limit the embodiments disclosed within this specification. Any of a variety of different techniques for controlling or changing the value of $\alpha$ over time or iterations of method 500 can be used.

In one embodiment, the overall control set overlap can simply indicate the percentage of cells of the current placement that exhibit control set overlap out of the total number of cells of the target programmable IC. In another embodiment, the overall control set overlap can be an average of the control set density taken across all cells of the target programmable IC. For example, the overall control set overlap can be a weighted average in which cells with greater control set densities are greater contributors to the overall control set overlap of the current placement. In that case, a sum of the control set densities can be calculated across the entire target programmable IC. The sum can then be divided by the total number of components of the circuit design to yield the overall control set overlap.

In step 570, the placement system can determine whether the overall control set overlap is less than a threshold "A." In one embodiment, threshold A can be set to a percentage in terms of overall control set overlap. While the particular percentage used for threshold A can vary, examples of values can include, but are not limited to, 5%, 10%, 15%, 20%, 25%, 30%, 35%, 40%, or the like. The examples disclosed herein are provided for purposes of illustration only and, as such, are not intended to preclude other values.

If the overall control set overlap is less than threshold A, method 500 can continue to step 575. If not, method 500 can proceed to step 580. In step 575, as the overall control set overlap has decreased to an acceptable level, each of the control set related steps can be effectively disabled. For example, in one embodiment, each of steps 530, 540, 550, 555, 565, 570, and 575 can be disabled. In another embodiment, with regard to step 540, for example, the value of $e_{CS}$ can be automatically set to zero. In another embodiment, the value of $\alpha$ can be set to zero to reduce the contribution of $e_{CS}$ to zero in the combined force. It should be appreciated that an "acceptable level" in terms of overall control set overlap, and therefore, threshold A, can be determined according to the level of overall control set overlap that the detailed placement phase can remove from the circuit design without (1) failing to generate a feasible placement; and/or (2) generating a placement that degrades one or more performance metrics, e.g., timing, power consumption, or the like, of the circuit design more than a predetermined amount or percentage.

When the overall control set overlap becomes less than threshold A, subsequent iterations of method 500, with regard to step 550, will select cells of physical overlap in lieu of those with control set overlap. As method 500 continues to iterate, the combined force includes the physical force component as $e_{PHY}$, with the control set force component $e_{CS}$ being effectively zero. Thus, as noted, in iterations of step 555 after the overall control set overlap becomes less than threshold A, the components selected to which the combined force is applied will be selected from cells comprising physical overlap.

Continuing with step 580, the placement system can determine whether overall physical overlap of the circuit design is less than a threshold "B." The overall physical overlap of the circuit design can be an average of the physical density of each cell of the current placement of the circuit design calculated across all cells. Alternatively, the overall physical overlap can be a percentage of the cells that exhibit physical overlap out of the total number of cells of the target programmable IC. When the overall physical overlap is below threshold B, method 500 can continue to step 585. Otherwise, method 500 can loop back to step 525 to continue iterating. Examples of values of the second threshold can include, but are not limited to, 5%, 10%, 15%, 20%, 25%, 30%, 35%, 40%, or the like. The examples disclosed herein are provided for purposes of illustration only and, as such, are not intended to preclude other values.

As was the case with respect to overall control set overlap, it should be appreciated that an "acceptable level" in terms of overall physical overlap, and therefore, threshold B, can be determined according to the level of physical overlap that the detailed placement phase can remove from the circuit design without (1) failing to generate a feasible placement solution; and/or (2) generating a placement solution that degrades one or more performance metrics, e.g., timing, power consumption, or the like, of the circuit design more than a predetermined amount or percentage.

In step 585, the placement system can output the circuit design, including the global placement determined according to method 500. As used herein, "outputting" and/or "output" can mean, for example, writing to a file, writing to a user display or other output device, storing in memory, playing audible notifications, sending or transmitting to another system, exporting, or the like.

Figure 6:
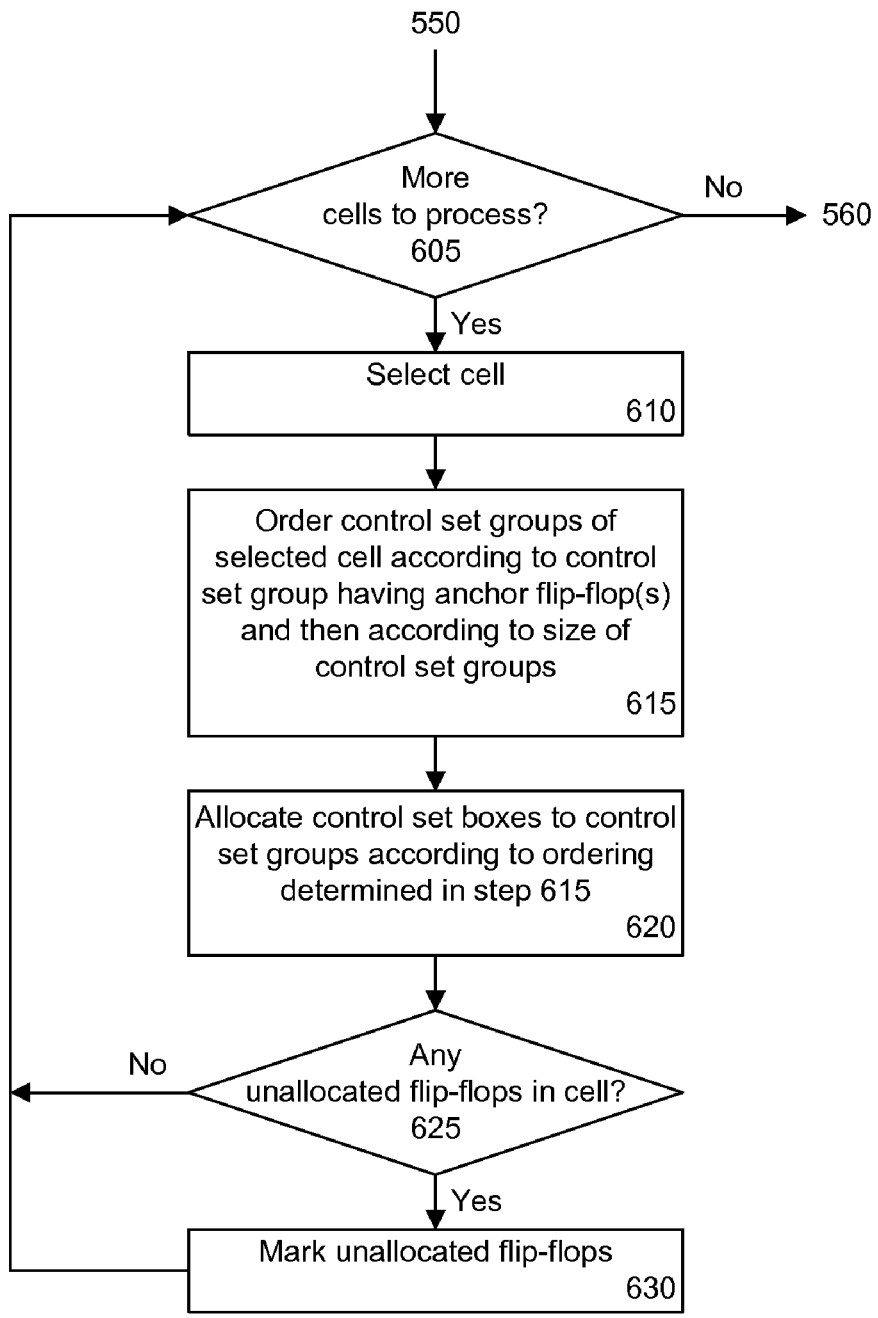
FIG. 6 is a second flow chart illustrating a method of selecting components to which forces are to be applied in accordance with another embodiment of the present invention.

FIG. 6 is a second flow chart illustrating a method of selecting components to which forces are to be applied in accordance with another embodiment of the present invention. More particularly, FIG. 6 illustrates a method of performing step 555 as described with reference to FIG. 5. In one embodiment, however, FIG. 6 can be used only when selecting components to which the combined force is applied from cells identified as having control set overlap. Accordingly, proceeding from step 550, the placement system, in step 605, can determine whether there are more cells as determined in step 550 to process. If so, the method can continue to step 610 where an unprocessed cell of the cells identified in step 550 is selected. If not, the method can proceed to step 560 as shown.

Continuing with step 615, the placement system can order control set groups of the selected cell according to ranking criteria. Any control set that includes an anchor flip-flop, e.g., a flip-flop with a predetermined, or pre-assigned location on the programmable IC, can be ranked first or highest. After any control sets with anchor flip-flops, the remaining control sets of the selected cell can be ordered according to size. Control sets with more flip-flops are ranked higher than control sets with fewer flip-flops.

In step 620, the placement system can allocate control set clusters to control set groups according to the ordering determined in step 615. Each cell will include a limited number of control set clusters. Referring to the previous examples where a control set cluster was equivalent to a slice, each cell can be formed of two slices. Using this configuration, each cell includes two control set clusters available for assignment to control set groups. Once each control set cluster of the cell is allocated to a control set group, or flip-flops of a control set group, in step 625, the placement system determines whether any unallocated flip-flops remain in the selected cell. If no flip-flops in the selected cell are unallocated, the method can loop back to step 605 to continue processing. If one or more flip-flops in the selected cell are unallocated, the method can proceed to step 630.

In step 630, the placement system can mark the unallocated flip-flops as the flip-flops to which the combined force e is applied. After step 630, the method can loop back to step 605 to continue processing.

Figure 7A:
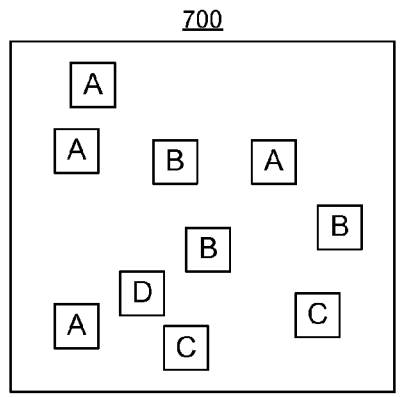
FIGS. 7A and 7B, taken together, illustrate the application of forces in accordance with another embodiment of the present invention.
Figure 7B:
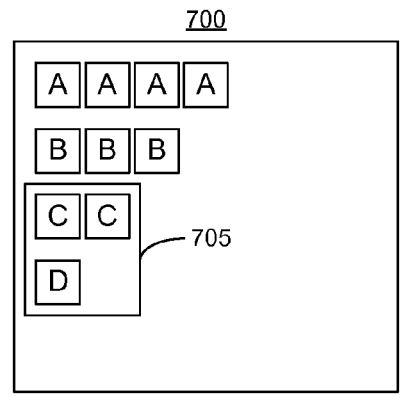

FIGS. 7A and 7B, taken together, illustrate the application of forces in accordance with another embodiment of the present invention. Each of FIGS. 7A and 7B illustrates a cell 700 of a programmable IC. For purposes of illustration, cell 700 can include two control set clusters. In this example, each control set cluster can correspond to a slice, which includes four flip-flop sites. Each flip-flop assigned to a slice must be a member of the same control set. In other words, each control set cluster, or slice, can include only a single control set group.

FIG. 7A illustrates that cell 700 includes a plurality of flip-flops. Each flip-flop is labeled with a tag indicating the membership of the flip-flop within a particular control set group. Thus, each flip-flop labeled with "A" is in control set group A. Each flip-flop labeled with "B" is in control set group B. Each flip-flop labeled with "C" is in control set group C. Finally, each flip-flop labeled with "D" is in control set group D. As shown, cell 700 of FIG. 7A has a physical overlap of two flip-flops, corresponding to a physical density of two. Further, cell 700 includes flip-flops corresponding to four different control set groups (A, B, C, and D). Thus, cell 700 has a control set density of 16.

FIG. 7B illustrates the ranking that is performed with respect to cell 700. In this example, none of the flip-flops are anchor flip-flops. Accordingly, the control set groups A, B, C, and D are ranked according to size. Ranking is illustrated with the highest ranked control set group in the top row. Ranking decreases row-by-row from top to bottom. Thus, control set group A is ranked first, or highest, and consumes all four sites of one control set cluster of cell 700. Control set group B is ranked second and consumes three sites of the second control set cluster of cell 700. Control set group C is ranked third and control set group D is ranked fourth. Though one flip-flop site remains within cell 700 of FIG. 7B, no other flip-flops can be assigned to that flip-flop site without violating the control set constraints since doing so would place two control set groups within a single slice. Accordingly, each flip-flop of control set groups C and D will be marked as unallocated and have a combined force applied, as indicated by box 705, for movement out of cell 700.

Figure 8A:
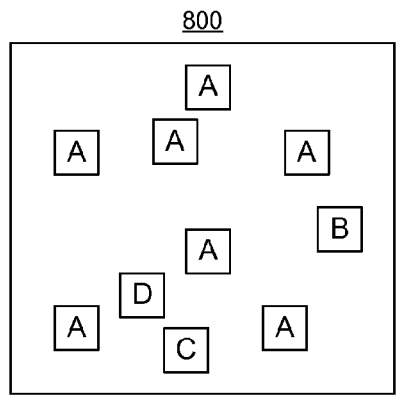
FIGS. 8A and 8B, taken together, illustrate the application of forces in accordance with another embodiment of the present invention.
Figure 8B:
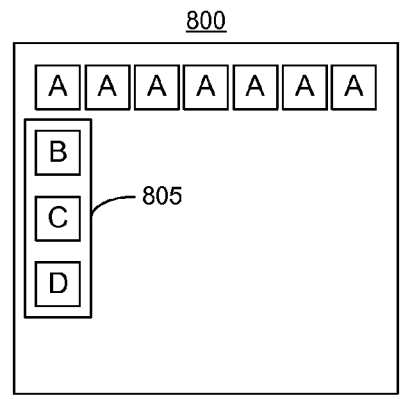

FIGS. 8A and 8B, taken together, illustrate the application of forces in accordance with another embodiment of the present invention. FIGS. 8A and 8B also can represent a cell 800 that is formed of two control set clusters, with each control set cluster corresponding to a slice. Cell 800 can include 8 sites as each slice includes four sites. Each slice further can include only a single control set group. In the example of FIG. 8A, control set group A includes seven flip-flops. Since none of the flip-flops in the example shown within cell 800 of FIG. 8A is an anchor flip-flop, control set group A, having the most flip-flops of any control set group of cell 800 is ranked highest.

Accordingly, in FIG. 8B, the seven flip-flops of control set group A are allocated to each of the four sites of the first control set cluster of cell 800. The remaining three flip-flops are allocated to the second control set cluster of cell 800. Though one site remains, no other flip-flop can be assigned to that site without violating the control set constraint since that would result in a single slice including two control set groups. Box 805 illustrates those flip-flops that are unallocated and marked for application of the combined force for movement out of cell 800.

Figure 9A:
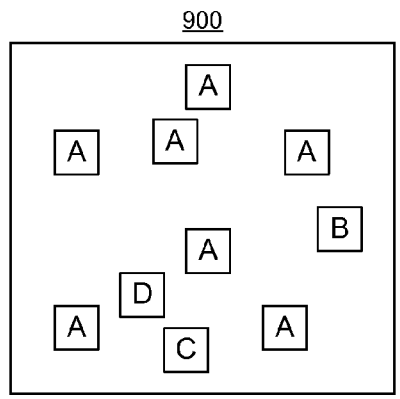
FIGS. 9A and 9B, taken together, illustrate the application of forces in accordance with another embodiment of the present invention.
Figure 9B:
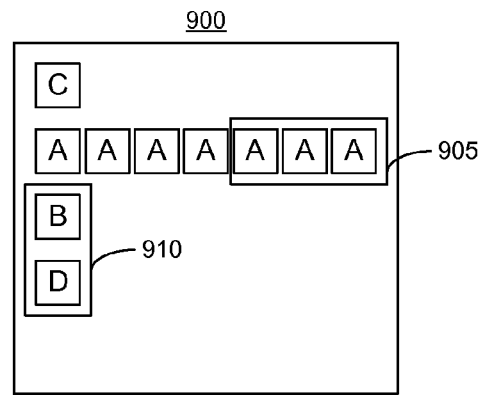

FIGS. 9A and 9B, taken together, illustrate the application of control set forces in accordance with another embodiment of the present invention. FIGS. 9A and 9B also illustrate a cell 900 that includes two slices, where each slice corresponds to a control set cluster, and each slice includes four flip-flop sites. As noted, each slice can include only a single control group. In FIG. 9A, the single flip-flop of control set group C is an anchor flip-flop. Control set groups that include an anchor flip-flop are ranked the highest. Within cell 900 of FIG. 9B, control set group C is ranked the highest and is assigned to the first control set cluster. Control set group C consumes an entire control set cluster since no other flip-flops can be located in a flip-flop site of that control set cluster without violating the control set constraint.

The next highest ranked control set group is control set group A. Control set group A, having the largest number of flip-flops, is ranked second. Accordingly, four flip-flops of control set group A can be located in the four flip-flop sites of the second control set cluster of cell 900 of FIG. 9B. As shown, the remaining three flip-flops of control set group A are marked, as indicated by box 905, as well as each flip-flop of control set groups B and D, as indicated by box 910, for application of the combined force for movement out of cell 900.

The embodiments described within this specification provide a method, system, and apparatus, e.g., a machine readable storage device, for performing global placement of a circuit design for implementation upon a target programmable IC. In accordance with the embodiments described, control set constraints can be incorporated into the placement solution to ensure that the result of global placement is largely feasible in that a detailed placement phase can generate a placement that is free of both physical and control set overlaps without sacrificing circuit performance.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. For example, blocks of the flow chart describing an operation relating to physical density or physical overlap can be performed in parallel with the corresponding operation relating to control set density or control set overlap as the case may be. It also should be noted that each block of the flowchart illustrations, and combinations of blocks in the flowchart illustrations, can be implemented by special purpose hardware-based systems that perform the specified functions or acts, or combinations of special purpose hardware and computer instructions.

Embodiments of the present invention can be realized in hardware or a combination of hardware and software. The embodiments can be realized in a centralized fashion in one data processing system or in a distributed fashion where different elements are spread across several interconnected data processing systems. Any kind of data processing system or other apparatus adapted for carrying out the methods described herein is suited. A typical combination of hardware and software can be a general-purpose computer system with a computer program that, when being loaded and executed, controls the computer system such that it carries out the methods described herein.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, magneto-optical media, computer memory such as random access memory or hard disk(s), or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A method of globally placing a circuit design on a programmable integrated circuit device (programmable IC), the method comprising:
subdividing, by a placement system, the programmable IC into a grid comprising a plurality of cells;
assigning each component of a selected component type of the circuit design to one of a plurality of control set groups according to a control set of the component, wherein each component of a control set group has same control signals comprising a same clock signal and at least one of a same set signal or a same enable signal specifying the control set;
calculating a force comprising a control set force component that depends upon control set overlap within the plurality of cells, wherein the control set overlap indicates whether a cell of the plurality of cells comprises components belonging to a number of control sets that is larger than supported by the cell;
applying the force to at least one selected component of a cell comprising overlap;
assigning components of the circuit design to locations on the programmable IC by solving a set of linear equations that depend upon application of the force to the at least one selected component, thereby specifying a global placement; and
outputting the circuit design comprising the global placement.

2. The method of claim 1, wherein calculating a force comprises calculating the control set force component as a function of control set density.

3. The method of claim 2, further comprising selecting the control set density to depend upon a control set capacity specifying a number of allowed control sets within at least one selected cell and a control set occupancy specifying a number of control sets that exist within the at least one selected cell.

4. The method of claim 1, further comprising selecting the at least one component to which the force is applied.

5. The method of claim 4, further comprising:
selecting at least one of the plurality of cells comprising control set overlap as a current cell, wherein the current cell comprises a plurality of control set clusters;
identifying each control set group in the current cell, wherein each control set group is defined by each flip-flop having a same control set;
ordering the control set groups;
allocating components of the control set groups to control set clusters of the current cell according to the ordering of the control set groups; and
selecting each component not allocated to a control set cluster for application of the force.

6. The method of claim 5, wherein allocating components of the control set groups to control set clusters comprises:
first allocating control set clusters to each control set group comprising at least one anchor component; and
second allocating control set clusters to components of control set groups according to size of each control set group.

7. The method of claim 1, further comprising selectively adjusting the control set force for at least one subsequent iteration of global placement.

8. A system for globally placing a circuit design on a programmable integrated circuit device (programmable IC), the system comprising:
a memory comprising computer-usable program code; and
a processor that, responsive to executing the computer-usable program code, is configured to perform:
subdividing the programmable IC into a grid comprising a plurality of cells;
assigning each component of a selected component type of the circuit design to one of a plurality of control set groups according to a control set of the component, wherein each component of a control set group has same control signals comprising a same clock signal and at least one of a same set signal or a same enable signal specifying the control set;
calculating a force comprising a control set force component that depends upon control set overlap within the plurality of cells, wherein the control set overlap indicates whether a cell of the plurality of cells comprises components belonging to a number of control sets that is larger than supported by the cell;
applying the force to at least one selected component of a cell comprising overlap;
assigning components of the circuit design to locations on the programmable IC by solving a set of linear equations that depend upon application of the force to the at least one selected component, thereby specifying a global placement; and
outputting the circuit design comprising the global placement.

9. The system of claim 8, wherein the processor calculates the control set force component as a function of control set density.

10. The system of claim 9, wherein the processor further selects the control set density to depend upon a control set capacity specifying a number of allowed control sets within at least one selected cell and a control set occupancy specifying a number of control sets that exist within the at least one selected cell.

11. The system of claim 8, wherein the processor further selects the at least one component to which the force is applied.

12. The system of claim 11, wherein the processor further:
selects at least one of the plurality of cells comprising control set overlap as a current cell, wherein the current cell comprises a plurality of control set clusters;
identifies each control set group in the current cell, wherein each control set group is defined by each flip-flop having a same control set;
orders the control set groups;
allocates components of the control set groups to control set clusters of the current cell according to the ordering of the control set groups; and
selects each component not allocated to a control set cluster for application of the force.

13. The system of claim 12, wherein the processor further:
first allocates control set clusters to each control set group comprising at least one anchor component; and
second allocates control set clusters to components of control set groups according to size of each control set group.

14. The system of claim 8, wherein the processor further selectively adjusts the control set force for at least one subsequent iteration of global placement.

15. A computer program product comprising:
- a non-transitory computer-usable medium comprising computer-usable program code that, when executed by a computer, globally places a circuit design on a programmable integrated circuit device (programmable IC), the computer-usable medium comprising:
- computer-usable program code that subdivides the programmable IC into a grid comprising a plurality of cells;
- computer-usable program code that assigns each component of a selected component type of the circuit design to one of a plurality of control set groups according to a control set of the component, wherein each component of a control set group has same control signals comprising a same clock signal and at least one of a same set signal or a same enable signal specifying the control set;
- computer-usable program code that calculates a force comprising a control set force component that depends upon control set overlap within the plurality of cells, wherein the control set overlap indicates whether a cell of the plurality of cells comprises components belonging to a number of control sets that is larger than supported by the cell;
- computer-usable program code that applies the force to at least one selected component of a cell comprising overlap;
- computer-usable program code that assigns components of the circuit design to locations on the programmable IC by solving a set of linear equations that depend upon application of the force to the at least one selected component, thereby specifying a global placement; and
- computer-usable program code that outputs the circuit design comprising the global placement.

16. The computer program product of claim 15, wherein the computer-usable program code that calculates a force comprises computer-usable program code that calculates the control set force component as a function of control set density.

17. The computer program product of claim 16, wherein the computer-usable medium further comprises computer-usable program code that selects the control set density to depend upon a control set capacity specifying a number of allowed control sets within at least one selected cell and a control set occupancy specifying a number of control sets that exist within the at least one selected cell.

18. The computer program product of claim 15, wherein the computer-usable medium further comprises computer-usable program code that selects the at least one component to which the force is applied.

19. The computer program product of claim 18, wherein the computer-usable medium further comprises:
- computer-usable program code that selects at least one of the plurality of cells comprising control set overlap as a current cell, wherein the current cell comprises a plurality of control set clusters;
- computer-usable program code that identifies each control set group in the current cell, wherein each control set group is defined by each flip-flop having a same control set;
- computer-usable program code that orders the control set groups;
- computer-usable program code that allocates components of the control set groups to control set clusters of the current cell according to the ordering of the control set groups; and
- computer-usable program code that selects each component not allocated to a control set cluster for application of the force.

20. The computer program product of claim 19, wherein the computer-usable program code that allocates components of the control set groups to control set clusters comprises:
- computer-usable program code that first allocates control set clusters to each control set group comprising at least one anchor component; and
- computer-usable program code that second allocates control set clusters to components of control set groups according to size of each control set group.

* * * * *